(12) United States Patent
Fan et al.

(10) Patent No.: US 9,342,424 B2
(45) Date of Patent: May 17, 2016

(54) OPTIMAL TEST FLOW SCHEDULING WITHIN AUTOMATED TEST EQUIPMENT FOR MINIMIZED MEAN TIME TO DETECT FAILURE

(71) Applicant: International Business Machines Corporation, Armonk, NY (US)

(72) Inventors: Wei Fan, New York, NY (US); Nagui Halim, Yorktown Heights, NY (US); Mark C. Johnson, South Burlington, VT (US); Srinivasan Parthasarathy, Yonkers, NY (US); Deepak S. Turaga, Elmsford, NY (US); Olivier Verscheure, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 277 days.

(21) Appl. No.: 13/972,566

(22) Filed: Aug. 21, 2013

(65) Prior Publication Data
US 2015/0058668 A1    Feb. 26, 2015

Related U.S. Application Data

(63) Continuation of application No. 12/784,142, filed on May 20, 2010, now abandoned.

(51) Int. Cl.
*G06F 11/00* (2006.01)
*G06F 11/27* (2006.01)
*G01R 31/28* (2006.01)

(52) U.S. Cl.
CPC ............ *G06F 11/27* (2013.01); *G01R 31/2894* (2013.01)

(58) Field of Classification Search
CPC .......... G01R 31/2834; G01R 31/2851; G01R 31/2894; G01R 31/31707; G01R 31/318371; G06F 11/27
See application file for complete search history.

(56) References Cited

U.S. PATENT DOCUMENTS

| 5,369,604 | A |   | 11/1994 | Ravindranath et al. |
|-----------|---|---|---------|---------------------|
| 5,442,562 | A |   | 8/1995  | Hopkins et al. |
| 6,078,189 | A | * | 6/2000  | Noel ........................ 324/750.01 |
| 6,138,249 | A |   | 10/2000 | Nolet |

(Continued)

OTHER PUBLICATIONS

Babu, S., et al., "Adaptive Ordering of Pipelined Stream Filters", SIGMOD, 2004, pp. 407-418, New York, NY, USA, ACM Press.

(Continued)

*Primary Examiner* — Michael Maskulinski
(74) *Attorney, Agent, or Firm* — Scully, Scott, Murphy & Presser, P.C.; Jeff Tang, Esq.

(57) ABSTRACT

The present invention describes a method and system for optimizing a test flow within each ATE (Automated Test Equipment) station. The test flow includes a plurality of test blocks. A test block includes a plurality of individual tests. A computing system schedule the test flow based one or more of: a test failure model, test block duration and a yield model. The failure model determines an order or sequence of the test blocks. There are at least two failure models: independent failure model and dependant failure model. The yield model describes whether a semiconductor chip is defective or not. Upon completing the scheduling, the ATE station conducts tests according to the scheduled test flow. The present invention can also be applied to software testing.

17 Claims, 4 Drawing Sheets

(56) References Cited

U.S. PATENT DOCUMENTS

| | | | |
|---|---|---|---|
| 6,167,545 | A | 12/2000 | Statovici et al. |
| 6,367,041 | B1 | 4/2002 | Statovici et al. |
| 6,442,445 | B1 | 8/2002 | Bunkofske et al. |
| 6,549,864 | B1 | 4/2003 | Potyrailo |
| 6,584,368 | B2 | 6/2003 | Bunkofske et al. |
| 6,618,682 | B2 | 9/2003 | Bulaga et al. |
| 6,678,569 | B2 | 1/2004 | Bunkofske et al. |
| 6,711,514 | B1 | 3/2004 | Bibbee |
| 6,716,652 | B1 | 4/2004 | Ortlieb et al. |
| 6,792,373 | B2 | 9/2004 | Tabor |
| 7,047,463 | B1 | 5/2006 | Organ et al. |
| 7,248,939 | B1 | 7/2007 | Chamness et al. |
| 2002/0155628 | A1 | 10/2002 | Bulaga et al. |
| 2003/0182604 | A1 | 9/2003 | Hathaway et al. |
| 2004/0093180 | A1 | 5/2004 | Grey et al. |
| 2006/0195747 | A1 | 8/2006 | Pramanick et al. |
| 2009/0192754 | A1 | 7/2009 | Balog et al. |
| 2010/0235136 | A1 | 9/2010 | Bassett et al. |
| 2011/0288808 | A1* | 11/2011 | Fan et al. ............ 702/118 |
| 2012/0246514 | A1* | 9/2012 | Chen et al. ............ 714/32 |
| 2013/0006567 | A1 | 1/2013 | Horn |

OTHER PUBLICATIONS

Uzsoy, R., et al., "Production Scheduling Algorithms for a Semiconductor Test Facility", IEEE Transactions on Semiconductor Manufacturing, 1991, vol. 4, No. 4.

Xiong, H., et al., "Scheduling of Semiconductor Test Facility via Petri Nets and Hybrid Heuristic Search", IEEE Transactions on Semiconductor Manufacturing, Aug. 1998, vol. 11, No. 3.

* cited by examiner

OPTIMAL TEST FLOW SCHEDULING WITHIN AUTOMATED TEST EQUIPMENT FOR MINIMIZED MEAN TIME TO DETECT FAILURE

CROSS REFERENCE TO RELATED APPLICATION

This application is a continuation of U.S. patent application Ser. No. 12/784,142, filed May 20, 2010 the entire content and disclosure of which is incorporated herein by reference.

BACKGROUND

The present invention generally relates to an ATE (Automated Test Equipment). More particularly, the present invention relates to optimizing a test flow within an ATE.

An ATE station refers to any automated device that is used to test printed circuit boards, integrated circuits or any other electronic components. Agilent® Medalist i1000D, Agilent® Medalist i3070, Teradyne® Catalyst, Teradyne® Tiger, Teradyne® FLEX and Teradyne® UltraFLEX are examples of an ATE station.

A semiconductor manufacturing process requires a sequence of complex operations on each wafer to create multi-layered physical and electrical structures that form a desired very large scale integrated circuitry (VLSI). Defects in the process may occur due to several operational, mechanical or chemical control errors, or due to environmental uncertainty, e.g., contamination during the process. After manufacturing of semiconductor chips on each wafer is complete, a set of comprehensive electrical (e.g., a test for power consumption of each semiconductor chip on each wafer), functional (e.g., a behavioral test on each semiconductor chip on each wafer), and characterization tests (e.g., tests measuring area or clock frequency of semiconductor chip on each wafer) are performed to determine an actual wafer and semiconductor chip yield. These tests require several detailed measurements of various electrical parameters, using different test configurations. An automated test equipment (ATE) station operates a sequence of such tests on all pins on all semiconductor chips on each wafer. Additional stages of tests may then be performed by other ATE stations to simulate different environmental settings, or measure different parameters etc. An end-to-end test process (i.e., process running all tests on every semiconductor chip) consumes a significant amount of time, and it is critical that the process be optimized appropriately. Optimization of the test process involves an appropriate scheduling of wafers and lots onto multiple ATE stations and across stages of test settings in order to optimally utilize testers and maximize test throughput.

It would be desirable that the optimization of the test process includes an optimization of a test flow within each ATE station to minimize a time to detect any defects or failures on a semiconductor chip or a wafer.

SUMMARY OF THE INVENTION

The present invention describes a system and method for optimizing a test flow within an ATE station to minimize the time to detect any defects or failures on a semiconductor chip or a wafer.

In one embodiment, there is provided a computer-implemented system for optimizing a test flow within an ATE (Automated Test Equipment) station for testing at least one semiconductor chip. The test flow lists a plurality of test blocks or tests in a sequence according to which the plurality of test blocks or tests are run. A test block including one or more tests that need to be run together in a specific sequence. The system determines one or more of: a test failure model, a test block duration and a yield model. The test failure model determines an order or sequence of the test blocks. The test block duration describes how long it takes for the ATE station to complete all tests in a test block. The yield model describes whether a semiconductor chip is defective or not. The system schedules the test flow based on said one or more of: the test failure model, the test block duration and the yield model. The system automatically conducting tests in the plurality of test blocks on at least one wafer or at least one semiconductor chip according to the scheduled test flow.

In a further embodiment, the test failure model comprises: an independent failure model and a dependent failure model. The independent failure model represents that a success or failure of a test, or test block, does not depend on a success or failure of any other tests or test blocks run before or after in the test flow. The dependent failure model represents that the success or failure of a test depends on a success or failure of another test or test block run before or after in the test flow.

In a further embodiment, the independent and dependant failure models respect the test process constraint on particular test blocks.

In another embodiment, there is provided a computer-implemented method for optimizing a test schedule of programming codes. The test schedule lists a plurality of test blocks or tests in a sequence according to which the plurality of test blocks or tests are run. A test block includes one or more tests that need to be run together in a specific sequence. The method comprises a step of determining one or more of: an independent failure model and a dependent failure model, a step of ordering the plurality of the test blocks according to the determined failure model, and a step of testing the programming codes according to the order. The independent failure model represents that a success or failure of a first test does not depend on a success or failure of a second test run before or after the first test. The dependent failure model represents that the success or failure of the first test depends on a success or failure of the second test run before or after the first test.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention. In the drawings.

DETAILED DESCRIPTION

Figure 1:
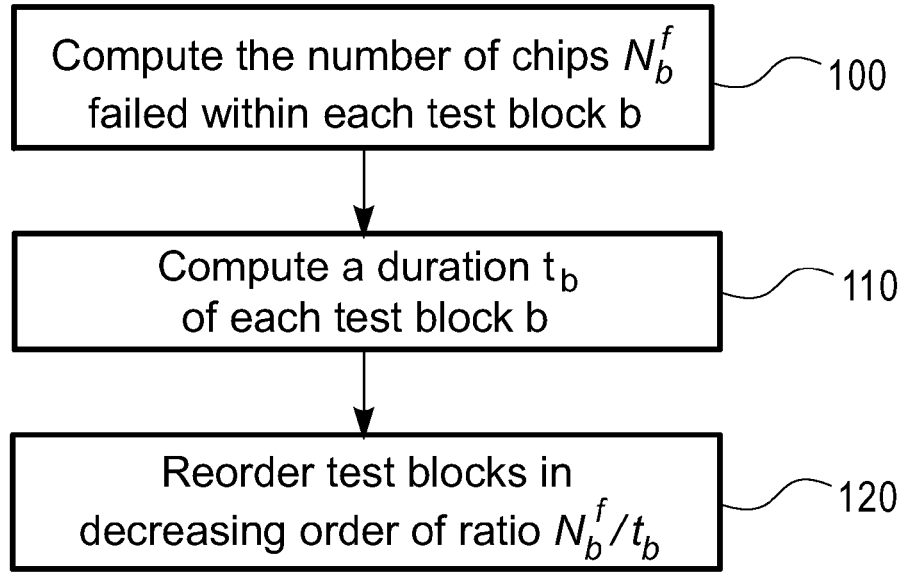
FIG. 1 illustrates a flow chart describing method steps for an independent failure model according to one embodiment of the present invention.

According to one embodiment of the present invention, a test floor may include a plurality of ATE stations (i.e., individual testers). An ATE station includes at least one test flow, which is defined by a test program (e.g., a test program 340 in FIG. 3). A test flow comprises a plurality of test blocks. The test flow lists the plurality of tests or test blocks in a sequence according to which they are run. A test block includes one or more individual tests, e.g., tests measuring leakage current and threshold voltage. The test block refers to a group of individual tests that could not or should not be separated. The individual tests in the test block need to be run together in a specific sequence. The individual testers may perform the individual tests.

According to one embodiment of the present invention, an ATE station receives as input one or more of: a test process structure, a test process constraint and a stopping criterion. The test process structure includes, but is not limited to: a list of tests to be performed or already performed on a wafer and/or a semiconductor chip, characteristics of the tests and individual durations of the tests. The test process constraint describes relationships between the tests, e.g., precedence and dependence relationships between the tests. The test stopping criterion describes when one or more of the tests will stop, e.g., stop on a single test fail or stop on successful completion of all tests. A computing system (e.g., a computer 305 in FIG. 3) running one or more of failure models (e.g., an independent failure mode illustrated in FIG. 1 and/or a dependent failure mode illustrated in FIG. 2) optimally order the tests to minimize a mean time (i.e., an average time) to detect a failure on a semiconductor chip or a wafer. The computing system may utilize history data (e.g., history data 300) to determine an optimal sequence of the tests.

According to one embodiment of the present invention, the computing system 305 determines one or more of: a test failure model, a test block duration and a yield model. The test failure model determines an order or sequence of the test blocks. The test failure model includes, but is not limited to: an independent failure model (i.e., method steps described in FIG. 1) and a dependent failure model (i.e., method steps described in FIG. 2). The independent failure model represents that a success or failure of a test does not depend on a success or failure of any other test(s) in the test flow. The dependent failure model represents that the success or failure of a test depends on a success or failure of another test(s) in the test flow. The test block duration describes how long it takes for the ATE station to complete all tests in a test block. The yield model describes whether a semiconductor chip is good or defective, e.g., labeling a semiconductor chip as defective if a test on the semiconductor chip resulted in a fail. Then, the computing system 305 schedules a test flow within an ATE station according to one or more of: the test failure model, the test block duration and the yield model. After the computing system 305 completes the scheduling, the ATE station (e.g., an ATE station 310 in FIG. 3) automatically conducts the tests included in the test flow on at least one wafer and/or at least one semiconductor chip according to the scheduled test flow.

According to a further embodiment, to schedule the test flow, the computing system 305 respects the test process constraints (e.g., particular test blocks and individual tests cannot be reordered) while running the failure model(s).

During a manufacturing test on a wafer or semiconductor module lot, an ATE station 310 tests all semiconductor chips on the wafer by running through its test flow (comprising electrical, functional and characterization tests) on each semiconductor chip to determine semiconductor chip yield and defects. Traditionally, this test flow is pre-determined and fixed for all the semiconductor chips. However, according to one embodiment of the present invention, the computing system 305 determines and/or modifies the test flow at real-time, e.g., by executing the failure models. Additionally, the test flow is logically partitioned into test blocks, e.g., by grouping inseparable tests (i.e. tests that must be tested together in a specific sequence, e.g., a test sequence for a memory test and repair) or groping tests that need to be tested in a specific order in the test flow. For example, electrical tests for detecting open circuits and short circuits may be grouped together and run first. When a semiconductor chip fails specific electrical or functional tests, the semiconductor chip is considered to have zero yield (along with a reason or sort code), and testing on the semiconductor chip may be stopped after performing all the tests in the relevant test block. Unless further characterization is warranted, remaining tests in other test blocks are not performed on the failed semiconductor chip and the ATE station starts testing a next semiconductor chip. An example of test names, test blocks, times per test for a semiconductor wafer or chip test is shown Table 1.

TABLE 1

Semiconductor test table illustrating test blocks, tests in each test block and test duration of each test.

| Test Block | Test name | Test Duration |
|---|---|---|
| Block 1 | Test 05034 | 0.05 sec |
| | Test 07803 | 0.03 sec |
| Block 2 | Test 01111 | 0.04 sec |
| | Test 09093 | 0.01 sec |
| | Test 07044 | 0.005 sec |
| Block 3 | Test 04342 | 0.02 sec |
| | Test 98743 | 0.05 sec |

In the Table 1, tests are grouped into three test blocks: a test block 1 including tests 05034 and 07803, a test block 2 including tests 01111, 09093 and 07044 and a test block 3 including tests 04342 and 98743. Though Table 1 illustrates these three test blocks, there may be a plurality of test blocks each including one or more tests. The Table 1 illustrates test duration per each test. The Table 1 may further include a separate column (not shown) for a sort code to indicate a sort associated with a failure. When a particular test results in a fail and a semiconductor chip is determined as a defective chip, the ATE station may stop testing the semiconductor chip and identify it with a fail sort. When multiple tests are grouped into a test block, even if one test results in a fail, the testing may continue until the end of the test block before stopping and assigning a sort. For example, even if Test 05034 results in a fail on a semiconductor chip, the ATE station will also run Test 07803 on that semiconductor chip before stopping. Other tests/test blocks will not need to be run on that semiconductor chip to determine it is defective. Additionally, in one embodiment, there may be fixed precedence constraints between blocks, e.g., the first five test blocks are required to be performed for an initialization of the ATE station. A goal of test flow optimization performed by the computing system 305 involves reordering the test blocks, while satisfying the test process constraint(s), to minimize a mean time to detect failure(s) on a semiconductor chip or a wafer. The computing system 305 runs both the independent failure model and the dependent failure model.

FIG. 1 illustrates method steps for the independent failure model according to one embodiment of the invention. Under the independent failure model, a failure of any test does not depend on a failure, success and/or any parametric measurements (e.g., measuring power consumption of a semiconductor chip, a threshold voltage of a semiconductor chip) of any other test. For example, consider that a number B of test blocks (numbered 1 through B) based on a predefined order, e.g. an order used in an ATE station. A test block b has test duration $t_b$ associated with it, corresponding to a sum of test durations for all tests within the test block b. Consider that there is a test process constraint: the first F (≤B) number of test blocks cannot be reordered as they are used for a setup or initialization of the ATE station. Thus, the first F numbers of tests need to be performed before any other tests. The goal of a test flow optimization (e.g., reordering tests based on a failure model) is to reorder test blocks F+1$^{st}$ through B$^{th}$ appropriately.

The computing system 305 accesses and retrieves from a storage device (e.g., a storage device 300) history data (e.g., a history of N number of tested semiconductor chips) representing a typical distribution of fails and passes of tests. At step 100 in FIG. 1, for each test block b, the computing system 305 computes $N^P$, the number of pass chips (i.e., the number of semiconductor chips passed all tests within the test block b) and $N_b^f$, the number of chips that were failed by a test within the test block b based on the history data. The computation done by the computing system 305 is based on $$N = \sum_{b=1}^{B} N_b^f + N^P \quad (1)$$

At step 110, the computing system 305 obtains or computes the test block duration of each test block b from the history data. At step 120, the computing system 305 schedules a test flow including the B number of test blocks to optimize a mean time to detect a failure for a set of N number of semiconductor chips, e.g., by ordering test blocks F+1$^{st}$ through B$^{th}$ in a decreasing order of a fraction $$\frac{N_b^f}{t_b},$$

where F+1≤b≤B. In other words, the computing system 305 places a test block having a largest value of $$\frac{N_b^f}{t_b}$$

at F+1$^{st}$ position in the test flow. The computing system 305 places a test block having a second largest value of $$\frac{N_b^f}{t_b}$$

at F+2$^{nd}$ position in the test flow. The computing system places a test block having a smallest value of $$\frac{N_b^f}{t_b}$$

at B$^{th}$ position in the test flow. Then, the ATE station conducts tests in the B number of test blocks according to the scheduled test flow. The ATE station or the computing system 305 may update the history data based on test results of the conducted tests. The computing system 305 may periodically, e.g., every 0.1 second, re-run steps 100-120 in FIG. 1.

The scheduled test flow can be implemented in a straightforward manner: the computing system 305 places tests with the highest likelihood of catching defective semiconductor chips in the shortest amount of times as early in the test flow as possible. Thus, the computing system 305 ensures that a resulting test flow minimizes a time to detect defective chip.

According to one embodiment, the independent failure model assumes that the computing system 305 can use the history data of the already tested or currently tested semiconductor chips or wafers to build an optimized test flow for testing. The computing system 305 may dynamically change the test flow in real-time. In order to achieve the dynamic real-time update of the test flow, the computing system 305 tracks $N_b^f$, $N^P$, and $t_b$ and periodically (e.g., every 0.1 second) reorders the tests in the test flow. A period of the update depends on variability in data characteristics of the history data. Additionally, there may be different optimal test flows for different collections of wafers based on their common manufacturing equipment or period of manufacturing. The optimal test flow can also be different for different spatial locations of semiconductor chips on the wafer, as semiconductor chips in edge locations may experience different defect types than semiconductor chips in center locations of the wafer. The historical data may also include semiconductor chips' test data from previous test operations—once the semiconductor chips have been properly identified through electronic chip identification (ECID), and any newly acquired test data that is pertinent.

Figure 2:
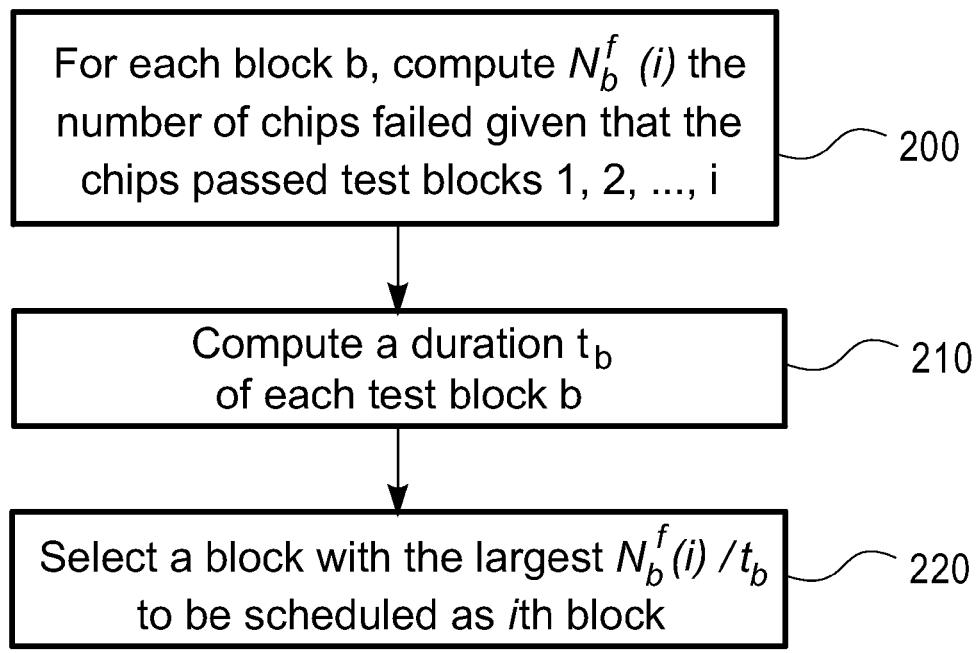
FIG. 2 illustrates a flow chart describing method steps for a dependent failure model according to one embodiment of the present invention.

FIG. 2 illustrates method steps for the dependant failure model according to one embodiment of the present invention. Under the dependent failure model, a conditional probability of a specific test resulting in a fail is a probability of a failure given the test results (e.g., pass rates, failure rates, or parametric measurements) of known dependent tests (i.e., a test A depends on a test B if a success or failure of the test A depends on a success or failure of the test B.) The conditional and marginal probabilities of the test results could be different and therefore result in different scheduling schemes (e.g., the dependent failure model different from the independent failure model). For instance, if test 05034 and test 07083 in Table 1 are related tests, the computing system 305 may compute a following conditional probability, a probability of that test 07083 results in fail given that test 05034 results in a success. In order to optimize a test flow under the dependant failure model, the history data further captures sufficient information about test failure dependencies including the conditional probabilities of tests resulting in failures given than previous tests resulted in passes, or outlier measurements.

The computing system 305 determines an optimal test flow by an iterative approach. At the end of iteration i, the computing system 305 determines the i$^{th}$ block to be scheduled in the test flow. Let $N_p$, $N_b^f$ and N denote the number of pass chips within a test block b, the number of semiconductor chips that were failed by a test within the test block b, and the total number of chips tested in the test block b respectively. Let $N_b^b(i)$ denote the number of semiconductor chips that were failed by the test block b given that the semiconductor chips did not fail at all the test blocks 1, ..., i, where the i represents a test block number i which is less than or equal to b. At step 200 in FIG. 2, for each test block b, computing system 305 computes the $N_b^f(i)$ based on the history data. The history data may include, but is not limited to: a summary of test effectiveness over time, i.e., for each test, the history data includes the number of semiconductor chips for which the test resulted in a success and the number of semiconductor chips for which the test resulted in a failure over a period of time. At step 210, the computing system 305 computes or obtains a test block duration $t_b$ for each test block b from the history data. At step 220, the computing system 305 respects a test process constraint, e.g., by scheduling F number of blocks which cannot be reordered at a beginning of the test flow. The F+1$^{st}$ block to be scheduled is a test block b with a largest ratio $$\frac{N_b^f(i)}{t_b},$$

where F+1≤b≤B. In other words, computing system 305 selects a test block with the largest $$\frac{N_b^f(i)}{t_b}$$

to be scheduled as the i$^{th}$ test block. More generally, the F+i+1$^{st}$ block in the test flow is a test block with a largest ratio $$\frac{N_b^f(F+i)}{t_b}.$$

The dependant failure model minimizes a test completion time, e.g., by scheduling test blocks in a decreasing order of $$\frac{N_b^f(i)}{t_b}.$$

After the computing system 305 completes scheduling the test flow, e.g., by running method steps 200-220, the ATE station conducts tests according to the scheduled test flow. The ATE station or computing system 305 may update the history data based on test results of the conducted tests. The computing system 305 may periodically, e.g., every 0.1 second, re-run steps 200-220 in FIG. 2.

According to one embodiment of the present invention, the computing system 305 uses history data to build an optimal schedule for testing as described above. The computing system 305 dynamically updates the scheduled test flow in real-time. In order to achieve the dynamic real-time update, the computing system 305 tracks quantities $N_b^f$, $N_b^f(i)$, $N_p$, $t_b$ and periodically reorders the tests in the test flow. A period of the update depends on the variability in data characteristics obtained during the testing.

Figure 3:
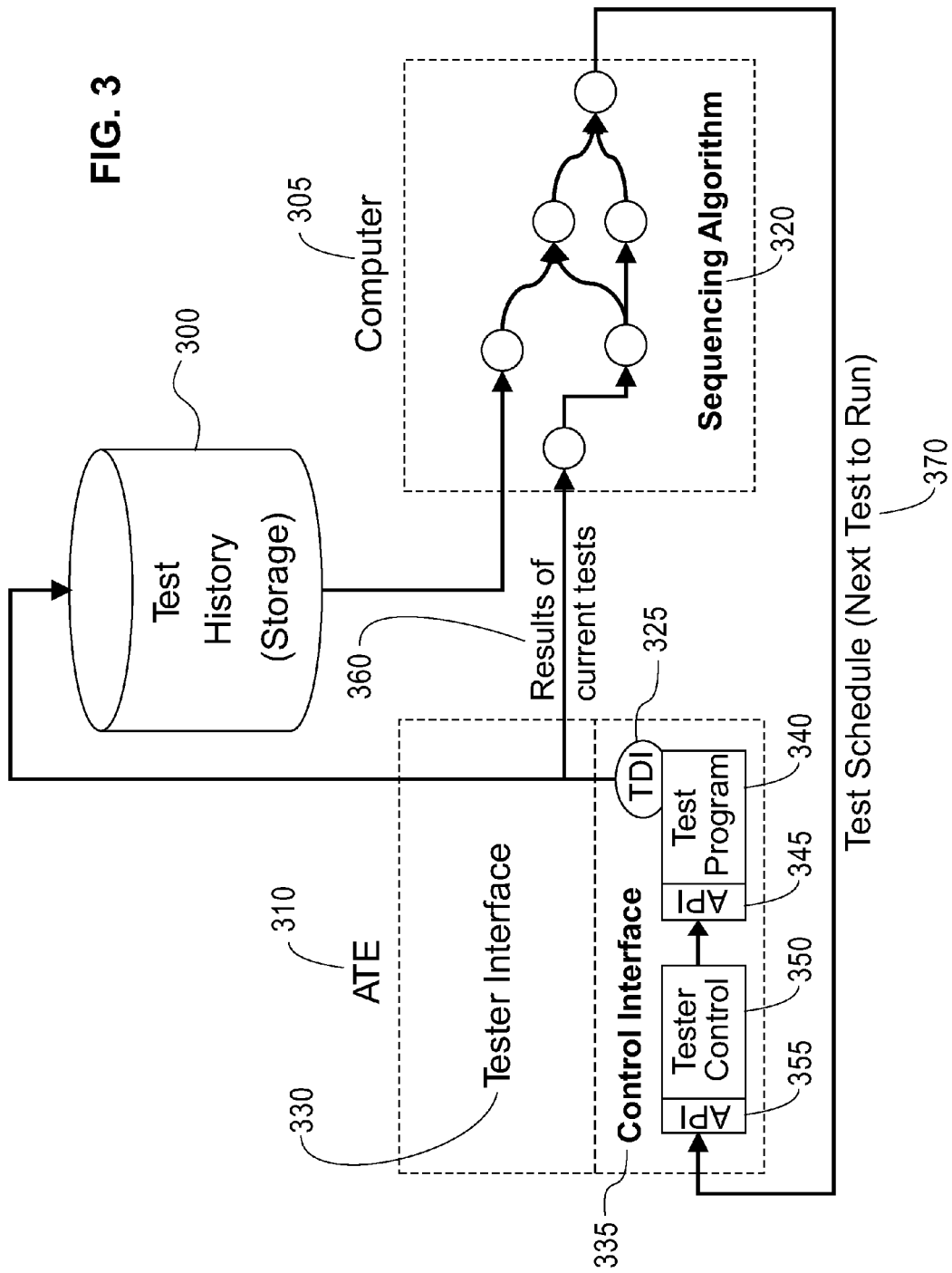
FIG. 3 illustrates a system diagram for running the failure models according to one embodiment of the present invention.

FIG. 3 illustrates system diagram depicting an ATE station 310, a storage device (e.g., a disk, a flash drive, an optical disc, etc.) storing history data 300 and the computing system 305 (e.g., a server device, a laptop, desktop, netbook, workstation, etc.). The ATE station 310 includes, but is not limited to: a tester interface 330 and control interface 335. The tester interface 330 provides common and compatible interfaces between the ATE station 310 and a broader network (i.e., a network to which the ATE station 310 is connected). The control interface 335 controls the individual testers. The control interface 335 includes, but is not limited to: a tester control system 350, test program 340 and test data interface (TDI) 325. The tester control system 350 may have an API (Application Programming Interface) 355 that specifies an interface of the tester control system 350 and controls behavior of objects specified in the interface of the tester control system 355. Test program 340 may also have an API 345 that specifies an interface of the test program 340 and controls behavior of objects specified in the interface of the test program 340. The TDI 325 updates the history data 300 based on test results of current tests 360. The TDI 325 also provides a test result of current tests 360 to the computing system 305. The computing system 305 runs sequencing algorithms 320 (e.g., independent failure model and/or dependent failure model) upon receiving the history data 300 and the test result of current tests 360. The computing system 305 outputs a new test flow 370 updating current test flow to the ATE station 310. Upon receiving the new test flow 370, the ATE station 310 runs tests according to the new test flow 370. The computing system 305 may apply the failure models to sorts (i.e., distinguishing defective semiconductor chips), functional tests, and any other tests used for evaluating a chip. The computing system 305 performs, makes decisions, and takes actions that may be initiated by a mid-chip test which follows a test performed during a testing of a semiconductor chip or after a completion of the testing on entire semiconductor chips in a wafer or samples of those semiconductor chips. Actions initiated by the mid-chip test immediately impact the testing of that single semiconductor chip.

Figure 4:
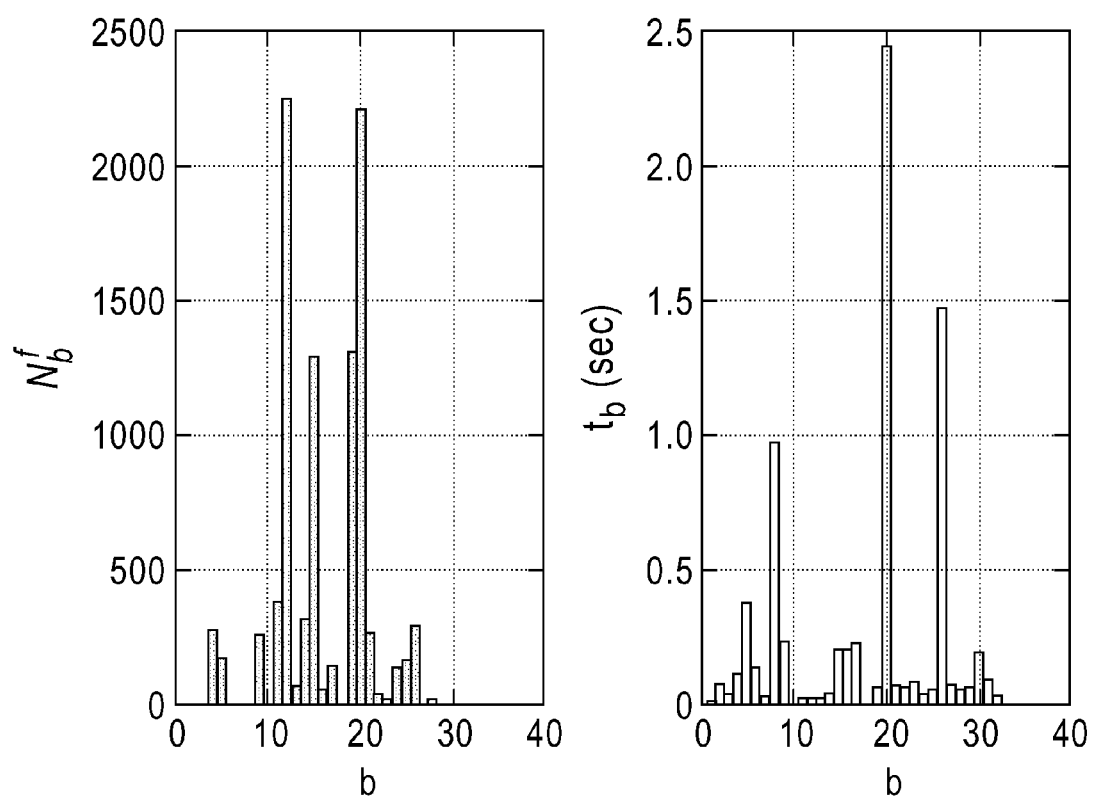
FIG. 4 illustrates a distribution of $N_b^f$ and $t_b$ for test blocks according to one exemplary embodiment of the present invention.

According to one exemplary embodiment, the computing system 305 accesses and retrieves history data of N semiconductor chips, e.g., N=21,645, with $N_p$=13,822. In this history data, a distribution for $N_b^f$ and $t_b$ for all 33 test blocks (i.e., B=33), given a predefined order (i.e., testing in an sequential order of a test block 1, test block 2, ..., test block 33), is illustrated in FIG. 4. Based on this predefined order, the mean time to detect a fail (a sum of test times for failing chips/the number of failing chips) on a semiconductor chip is 3.03 seconds, while the mean time for pass chips (i.e. chips that successfully pass all tests, and hence are tested by all blocks) is 7.57 seconds (a sum of test times for passing chips/the number of passing chips).

Given that the first five test blocks cannot be reordered, i.e., F=5, the computing system 305 schedules a rest of the test blocks (i.e., test block 6 to test block 33) based on a decreasing order of a fraction $$\frac{N_b^f}{t_b}.$$

Then, the computing system 305 obtains an optimal test flow illustrated in Table 2. The table 2 shows the predefined order Pre and the optimal test flow Opt.

TABLE 2

Test block reordering

| Pre | Opt | Pre | Opt | Pre | Opt |
|-----|-----|-----|-----|-----|-----|
| 1   | 1   | 12  | 5   | 23  | 21  |
| 2   | 2   | 13  | 13  | 24  | 10  |
| 3   | 3   | 14  | 8   | 25  | 12  |
| 4   | 4   | 15  | 9   | 26  | 22  |
| 5   | 5   | 16  | 19  | 27  | 29  |
| 6   | 18  | 17  | 17  | 28  | 20  |
| 7   | 25  | 18  | 28  | 29  | 30  |
| 8   | 26  | 19  | 6   | 30  | 23  |
| 9   | 24  | 20  | 15  | 31  | 31  |
| 10  | 27  | 21  | 11  | 32  | 32  |
| 11  | 7   | 22  | 16  | 33  | 33  |

The optimal test flow leads to a mean time to detect a fail of 1.52 seconds, while not affecting the mean time for pass chips. Thus, the computing system 305 achieves 49.8%

$$\left(\frac{3.03 - 1.52}{3.03} \times 100 = 49.8\right)$$

reduction in time to detect fail(s) and an overall reduction of testing time by 14.2%

$$\left(\frac{(3.03 + 7.57) - (1.52 + 7.57)}{(3.03 + 7.57)} \times 100 = 14.2\right),$$

e.g., by running the independent failure model and/or dependant failure model.

According to one embodiment of the present invention, the computing system 305 optimizes a test schedule of programming codes (e.g., codes written by C/C++, Java®, or .Net, etc.). The test schedule includes a plurality of test blocks. A test block comprises at least one test including, but not limited to: a unit test, an integration test, a regression test, a system test, a simulation test, compile/build time test, runtime test. The unit test is a software verification method that evaluates whether an individual unit (e.g., a class or function) of programming codes meets its intended design or behavior. The integration test is a software testing method in which individual software units are combined and evaluated together as a group. The regression test is a software testing method for discovering software bugs which did not exist in a previous software version but emerged in a current software version. For example, a function that worked correctly in the previous version might stop working properly at the current version. The system testing refers to a testing performed on a complete system to evaluate the system's performance and functionality. The simulation testing includes a simulation of a logic behavior of the programming code for various configurations of a software design. The compile/build time test is a test done during the compilation of the programming codes. The compile/build time test includes, but not limited to: checking syntaxes of the programming codes. The runtime test evaluates whether the programming codes operates as intended.

In this embodiment, $N_b^f$ refers to the number of programming codes failed within a test block b. In this embodiment, $t_b$ refers to a test duration of a test block b. $N_b^f(i)$ refers to the number of programming codes failed given those programming codes passed test blocks 1, 2, . . . i.

In this embodiment, the computing system 305 determines whether the independent failure model or the dependent failure model is used for the optimizing the test schedule. If there exist a plurality of dependencies between programming codes, e.g., methods or functions frequently calls other methods or functions, the computing system 305 may choose the dependent failure model. If the programming codes are independent each other, e.g., a unit testing, the computing system 305 may choose the independent failure model. Then, the computing system 305 arranges or orders test blocks according to the chosen model. The computing system 305 tests the programming codes according to the order.

In a further embodiment, the computing system 305 optimizes a test schedule for the system test and/or the simulation test conducted on the programming codes. In this embodiment, a test block is a stage of the system test and/or the simulation test. Upon choosing a failure model (the independent failure model or the dependent failure model), the computing system 305 arranges or orders the test blocks (stages) in the system test and/the simulation test according to the chosen failure model. Then, the computing system 305 conducts the system test and/or simulation test in the order.

In one embodiment, the method steps in FIGS. 1-2 are implemented in hardware or reconfigurable hardware, e.g., FPGA (Field Programmable Gate Array) or CPLD (Complex Programmable Logic Device), using a hardware description language (Verilog, VHDL, Handel-C, or System C). In another embodiment, the method steps in FIGS. 1-2 are implemented in a semiconductor chip, e.g., ASIC (Application-Specific Integrated Circuit), using a semi-custom design methodology, i.e., designing a chip using standard cells and a hardware description language. Thus, the hardware, reconfigurable hardware or the semiconductor chip operates the method steps described in FIGS. 1-2.

Figure 5:
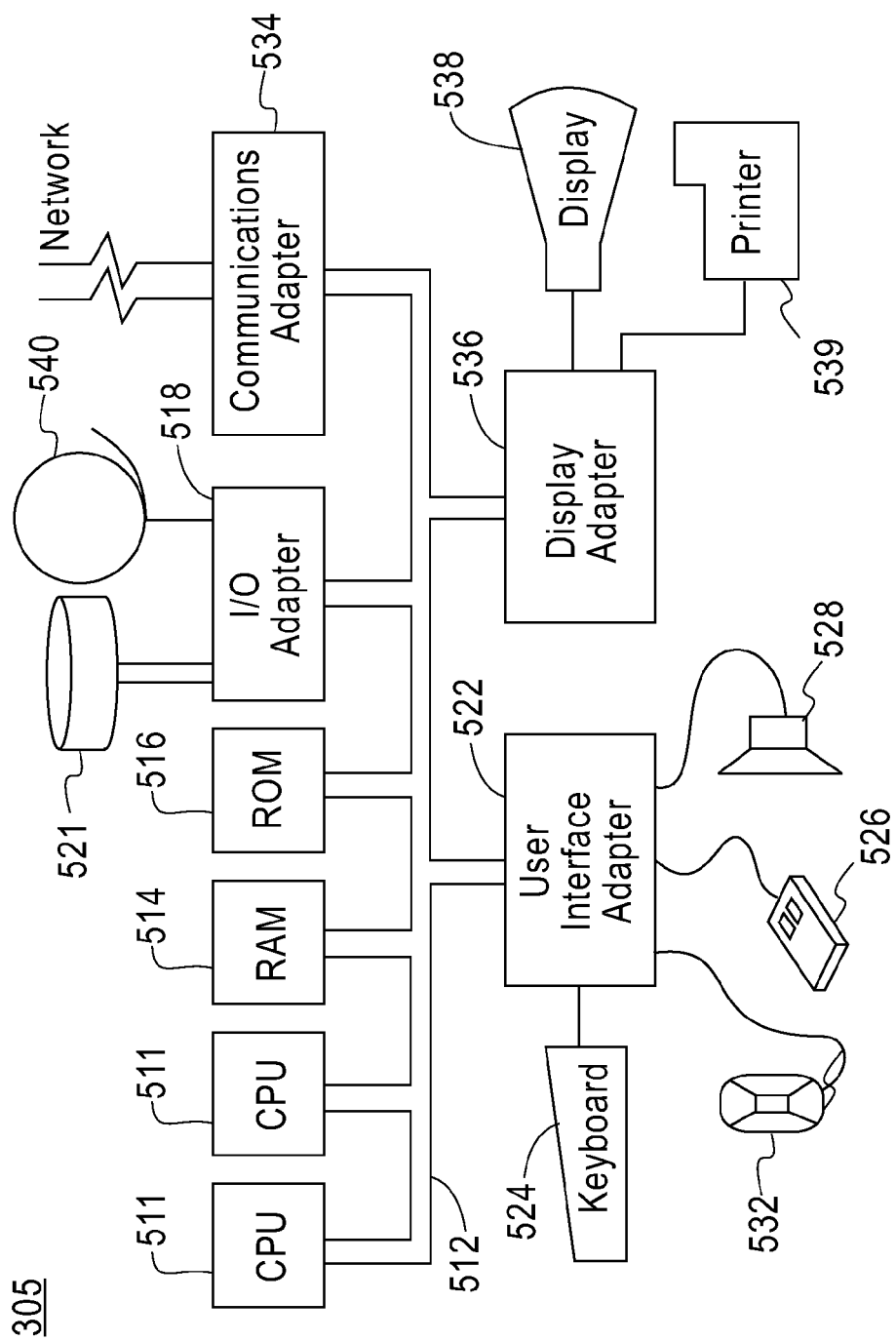
FIG. 5 illustrates an exemplary hardware configuration for running the failure models according to one embodiment of the present invention.

FIG. 5 illustrates an exemplary hardware configuration of a computing system 305 running and/or implementing the method steps in FIGS. 1-2. The hardware configuration preferably has at least one processor or central processing unit (CPU) 511. The CPUs 511 are interconnected via a system bus 512 to a random access memory (RAM) 514, read-only memory (ROM) 516, input/output (I/O) adapter 518 (for connecting peripheral devices such as disk units 521 and tape drives 540 to the bus 512), user interface adapter 522 (for connecting a keyboard 524, mouse 526, speaker 528, microphone 532, and/or other user interface device to the bus 512), a communication adapter 534 for connecting the system 305 to a data processing network, the Internet, an Intranet, a local area network (LAN), etc., and a display adapter 536 for connecting the bus 512 to a display device 538 and/or printer 539 (e.g., a digital printer of the like).

Although the embodiments of the present invention have been described in detail, it should be understood that various changes and substitutions can be made therein without departing from spirit and scope of the inventions as defined by the appended claims. Variations described for the present invention can be realized in any combination desirable for each particular application. Thus particular limitations, and/or embodiment enhancements described herein, which may have particular advantages to a particular application need not be used for all applications. Also, not all limitations need be implemented in methods, systems and/or apparatus including one or more concepts of the present invention.

The present invention can be realized in hardware, software, or a combination of hardware and software. A typical combination of hardware and software could be a general purpose computer system with a computer program that, when being loaded and run, controls the computer system such that it carries out the methods described herein. The present invention can also be embedded in a computer program product, which comprises all the features enabling the implementation of the methods described herein, and which—when loaded in a computer system—is able to carry out these methods.

Computer program means or computer program in the present context include any expression, in any language, code or notation, of a set of instructions intended to cause a system having an information processing capability to perform a particular function either directly or after conversion to another language, code or notation, and/or reproduction in a different material form.

Thus the invention includes an article of manufacture which comprises a computer usable medium having computer readable program code means embodied therein for causing a function described above. The computer readable program code means in the article of manufacture comprises computer readable program code means for causing a computer to effect the steps of a method of this invention. Similarly, the present invention may be implemented as a computer program product comprising a computer usable medium having computer readable program code means embodied therein for causing a function described above. The computer readable program code means in the computer program product comprising computer readable program code means for causing a computer to affect one or more functions of this invention. Furthermore, the present invention may be implemented as a program storage device readable by machine, tangibly embodying a program of instructions executable by the machine to perform method steps for causing one or more functions of this invention.

The present invention may be implemented as a computer readable medium (e.g., a compact disc, a magnetic disk, a hard disk, an optical disk, solid state drive, digital versatile disc) embodying program computer instructions (e.g., C, C++, Java, Assembly languages, .Net, Binary code) run by a processor (e.g., Intel® Core™, IBM® PowerPC®) for causing a computer to perform method steps of this invention. The present invention may include a computer program product including a computer readable storage medium having computer readable program code embodied therewith. The computer readable program code runs the one or more of functions of this invention.

It is noted that the foregoing has outlined some of the more pertinent objects and embodiments of the present invention. This invention may be used for many applications. Thus, although the description is made for particular arrangements and methods, the intent and concept of the invention is suitable and applicable to other arrangements and applications. It will be clear to those skilled in the art that modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art.

What is claimed is:

1. A computer-implemented method for optimizing a test flow within an ATE (Automated Test Equipment) station for testing at least one semiconductor chip, the test flow listing a plurality of test blocks or tests in a sequence according to which the plurality of test blocks or tests are run, a test block including one or more tests that need to be run together in a specific sequence, the method comprising:

obtaining history data from a storage device, the obtained history data including semiconductor chip test data from previous test operations;

determining, based on the obtained history data, a test failure model and one or more of: a test block duration and a yield model, the test failure model determining an order or sequence of the test blocks, the test block duration describing how long it takes for the ATE station to complete all tests in a test block, the yield model describing whether a semiconductor chip is defective or not;

scheduling the test flow based on one or more of: the test failure model, the test block duration and the yield model;

dynamically reordering the sequence of the tests or the test blocks within the scheduled test flow in real time, the dynamically reordered sequence of the tests or the test blocks minimizing a time to detect a failure in the at least one semiconductor chip; and automatically conducting the tests in the plurality of test blocks on at least one wafer or at least one semiconductor chip according to the scheduled test flow;

said determining said test failure model comprises steps of:

computing a value $N_b^f$ representing a number of semiconductor chips failed within each test block b based on the history data;

computing the test block duration $t_b$ of each test block b based on the history data; and reordering the plurality of test blocks in a decreasing order of a ratio $$\frac{N_b^f}{t_b}.$$

2. The computer-implemented method according to claim 1 further comprises:

receiving one or more of: a test process structure, a test process constraint and a stopping criterion, the test process structure including a list of the tests performed on the wafer and the semiconductor chip, characteristics of the tests and individual durations of the tests, the test process constraint describing relationships between the tests and the test stopping criterion describing when one or more of the tests will stop.

3. The computer-implemented method according to claim 1, wherein the test failure model further comprises steps of:

updating the history data after conducting the tests; and periodically re-running the computing the value $N_b^f$, the computing the duration based on the updated history data and the reordering.

4. The computer-implemented method according to claim 1, wherein the history data further include test failure dependency information including a conditional probability of a test resulting in a failure given that a previous test resulted in a pass.

5. The computer-implemented method according to claim 1, wherein the scheduling is different for each different collection of wafers or for each different spatial location of semiconductor chips on the wafers.

6. A computer-implemented method for optimizing a test flow within an ATE (Automated Test Equipment) station for testing at least one semiconductor chip, the test flow listing a plurality of test blocks or tests in a sequence according to which the plurality of test blocks or tests are run, a test block including one or more tests that need to be run together in a specific sequence, the method comprising:

obtaining history data from a storage device, the obtained history data including semiconductor chip test data from previous test operations;

determining, based on the obtained history data, a test failure model and one or more of: a test block duration and a yield model, the test failure model determining an order or sequence of the test blocks, the test block duration describing how long it takes for the ATE station to complete all tests in a test block, the yield model describing whether a semiconductor chip is defective or not;

scheduling the test flow based on one or more of: the test failure model, the test block duration and the yield model;

dynamically reordering the sequence of the tests or the test blocks within the scheduled test flow in real time, the dynamically reordered sequence of the tests or the test blocks minimizing a time to detect a failure in the at least one semiconductor chip; and automatically conducting the tests in the plurality of test blocks on at least one wafer or at least one semiconductor chip according to the scheduled test flow;

said determining said test failure model comprises steps of:

for each test block b, computing a value $N_b^f(i)$ based on the history data, the $N_b^f(i)$ representing a number of semiconductor chips failed by the test block b given that the semiconductor chips passed all test blocks $1, \ldots, i$, the i representing a test block number which is less than b;

computing the test block duration $t_b$ of each test block b based on the history data; and selecting a test block with a largest $$\frac{N_b^f(i)}{t_b}$$

to be scheduled as an ith test block in the test flow.

7. The computer-implemented method according to claim 6, wherein the test failure model further comprises steps of:
updating the history data after conducting the tests; and
periodically re-running the computing the value $N_b^f(i)$, the computing the duration based on the updated history data and the selecting.

8. The computer-implemented method according to claim 6, wherein the history data further include test failure dependency information including a conditional probability of a test resulting in a failure given that a previous test resulted in a pass.

9. The computer-implemented method according to claim 6, wherein the scheduling is different for each different collection of wafers or for each different spatial location of semiconductor chips on the wafers.

10. A computer-implemented system for optimizing a test flow within an ATE (Automated Test Equipment) station for testing at least one semiconductor chip, the test flow listing a plurality of test blocks or tests in a sequence according to which the plurality of test blocks or tests are run, a test block including one or more tests that need to be run together in a specific sequence, the system comprising:

a memory device; and
a processor unit in communication with the memory device, the processor unit performs steps of:

obtaining history data from a storage device, the obtained history data including semiconductor chip test data from previous test operations;

determining, based on the obtained history data, a test failure model and one or more of: a test block duration and a yield model, the test failure model determining an order or sequence of the test blocks, the test block duration describing how long it takes for the ATE station to complete all tests in a test block, the yield model describing whether a semiconductor chip is defective or not;

scheduling the test flow based on one or more of: the test failure model, the test block duration and the yield model;

dynamically reordering the sequence of the tests or the test blocks within the scheduled test flow in real time, the dynamically reordered sequence of the tests of the test blocks minimizing a time to detect a failure in the at least one semiconductor chip; and automatically conducting tests in the plurality of test blocks on at least one wafer or at least one semiconductor chip according to the scheduled test flow;

said processor unit determining said test failure model by:
computing a value $N_b^f$ representing a number of semiconductor chips failed within each test block b based on the history data;

computing the test block duration $t_b$ of each test block b based on the history data; and reordering the plurality of test blocks in a decreasing order of a ratio $$\frac{N_b^f}{t_b}.$$

11. The computer-implemented system according to claim 10, wherein the processor unit further performs a step of:
receiving one or more of: a test process structure, a test process constraint and a stopping criterion, the test process structure including a list of the tests performed on the wafer and the semiconductor chip, characteristics of the tests and individual durations of the tests, the test process constraint describing relationships between the tests and the test stopping criterion describing when one or more of the tests will stop.

12. The computer-implemented system according to claim 10, wherein the independent failure model further comprises steps of:
updating the history data after conducting the tests; and
periodically re-running the computing the value $N_b^f$, the computing the duration based on the updated history data and the reordering.

13. The computer-implemented system according to claim 10, wherein the history data further include test failure dependency information including a conditional probability of a test resulting in a failure given that a previous test resulted in a pass.

14. A computer-implemented system for optimizing a test flow within an ATE (Automated Test Equipment) station for testing at least one semiconductor chip, the test flow listing a plurality of test blocks or tests in a sequence according to which the plurality of test blocks or tests are run, a test block including one or more tests that need to be run together in a specific sequence, the system comprising:

a memory device; and
a processor unit in communication with the memory device, the processor unit performs steps of:

obtaining history data from a storage device, the obtained history data including semiconductor chip test data from previous test operations;

determining, based on the obtained history data, a test failure model and one or more of: a test block duration and a yield model, the test failure model determining an order or sequence of the test blocks, the test block duration describing how long it takes for the ATE station to complete all tests in a test block, the yield model describing whether a semiconductor chip is defective or not;

scheduling the test flow based on one or more of: the test failure model, the test block duration and the yield model;

dynamically reordering the sequence of the tests or the test blocks within the scheduled test flow in real time, the dynamically reordered sequence of the tests of the test blocks minimizing a time to detect a failure in the at least one semiconductor chip; and automatically conducting tests in the plurality of test blocks on at least one wafer or at least one semiconductor chip according to the scheduled test flow;

said processor unit determining said test failure model by:

for each test block b, computing a value $N_b^f(i)$ based on the history data, the $N_b^f(i)$ representing a number of semiconductor chips failed by the test block b given that the semiconductor chips passed all test blocks $1, \ldots, i$, the i representing a test block number which is less than b;

computing the test block duration $t_b$ of each test block b based on the history data; and selecting a test block with a largest $$\frac{N_b^f(i)}{t_b}$$

to be scheduled as an ith test block in the test flow.

15. The computer-implemented system according to claim 14, wherein the test failure model further comprises steps of: updating the history data after conducting the tests; and periodically re-running the computing $N_b^f(i)$, the computing the duration based on the updated history data and the selecting.

16. The computer-implemented system according to claim 14, wherein the history data further include test failure dependency information including a conditional probability of a test resulting in a failure given that a previous test resulted in a pass.

17. A computer program product for optimizing a test flow within each ATE (Automated Test Equipment), the test flow including a plurality of test blocks, a test block including a plurality of tests, the computer program product comprising: a non-transitory computer readable storage medium having computer readable program code embodied therewith, the computer readable program code comprising steps of:

obtaining history data from a storage device, the obtained history data including semiconductor chip test data from previous test operations;

determining, based on the obtained history data, a test failure mode and one or more of: a test block duration and a yield model, the test failure model determining an order or sequence of the test blocks, the test block duration describing how long it takes for the ATE station to complete all tests in a test block, the yield model describing whether a semiconductor chip is defective or not;

scheduling the test flow based on one or more of: the test failure model, the test block duration and the yield model;

dynamically reordering the sequence of the test blocks or the tests within the scheduled test flow in real time, the dynamically reordering sequence of the test blocks or the tests minimizing a time to detect a failure in the at least one semiconductor chip; and automatically conducting tests in the plurality of test blocks on at least one wafer or at least one semiconductor chip according to the scheduled test flow;

said determining said test failure model comprising: computing a value $N_b^f$ representing a number of semiconductor chips failed within each test block b based on the history data; computing the test block duration $t_b$ of each test block b based on the history data; and reordering the plurality of test blocks in a decreasing order of a ratio $$\frac{N_b^f}{t_b}.$$

* * * * *